United States Patent [19]
Gelbrich et al.

[11] Patent Number: 4,733,395
[45] Date of Patent: Mar. 22, 1988

[54] DIGITAL WORD GENERATOR

[75] Inventors: Hans-Joachim Gelbrich; Erwin Lehmann, both of Berlin, Fed. Rep. of Germany

[73] Assignee: Wandel & Goltermann GmbH & Co., Eningen U.A., Fed. Rep. of Germany

[21] Appl. No.: 852,336

[22] Filed: Apr. 15, 1986

[30] Foreign Application Priority Data

Apr. 16, 1985 [DE] Fed. Rep. of Germany ....... 3513551

[51] Int. Cl.⁴ .................................................. G01R 31/28
[52] U.S. Cl. ........................................ 371/27; 371/25
[58] Field of Search .................... 371/27, 21, 25; 324/73 R, 73 AJ, 73 PC

[56] References Cited

U.S. PATENT DOCUMENTS

| | | | |
|---|---|---|---|
| 4,442,519 | 4/1984 | Jones | 371/27 |
| 4,493,045 | 1/1985 | Hughues | 371/27 |
| 4,555,663 | 11/1985 | Shimizu | 371/27 |
| 4,586,181 | 4/1986 | Shimizu | 371/27 |
| 4,598,245 | 7/1986 | Groves | 371/27 |

*Primary Examiner*—Michael R. Fleming
*Attorney, Agent, or Firm*—Karl F. Ross; Herbert Dubno

[57] ABSTRACT

For imitating periodic signals occurring in digital transmission systems during some operating conditions in view of the multiplex structure a word generator is proposed which includes a read-only memory from which during a test signal cycle only 4116 permutations are successively read out of a total of 65,536 possible word sizes and permutations of e.g. a 16-bit word. The remaining 61,420 permutations are generated by shifting bit-by-bit the entire packet of continuous signals so that in case of a fixed 16 bit pattern the packet starts at a different bit position during each successive cycle and after 16 cycles all 16 bit positions occur as begin state. The shift is caused by a framing bit sequence which determines the test signal cycle and whose length is aliquant to n=16.

6 Claims, 5 Drawing Figures

| | COUNTING POSITION OF BINARY COUNTER 24 |
|---|---|
| 16 | 1 2 3 4 5 6 7 8 9 10 11 12 13 14 15 0 |
| 15 | 2 3 4 5 6 7 8 9 10 11 12 13 14 15 0 |
| 14 | 3 4 5 6 7 8 9 10 11 12 13 14 15 0 |
| 13 | 4 5 6 7 8 9 10 11 12 13 14 15 0 |
| 12 | 5 6 7 8 9 10 11 12 13 14 15 0 |
| 11 | 6 7 8 9 10 11 12 13 14 15 0 |
| 10 | 7 8 9 10 11 12 13 14 15 0 |
| 9 | 8 9 10 11 12 13 14 15 0 |

DIGITAL WORD GENERATOR

FIELD OF THE INVENTION

Our present invention relates to a digital word generator for automatically producing periodically appearing continuous characters or markers from n-bit words of all word weights and their permutations thereof.

BACKGROUND OF THE INVENTION

Certain periodic signals are used as messages or report markers or state characterizing markers in data transmission units and data processing units. Interpretation circuits provided for these characteristic signals or markers are thus to be examined for their response by adjusting the suitable signal at a send-side word generator. A receiver synchronized to the sending signal generates the same word and compares the generated word with the word received via the transmission path. Devices operating under these principles are known.

With respect to a comparison at the receiver-side, similarly built bit error measuring devices are known which utilize pseudorandom binary sequences (PRBS) as test signals. A PRBS of a length ($2^r-1$) bit contains periodic partial sequences only in very short sections of below a 2r bit length. During operation of the transmission paths to be tested, longer periodic sequences may be obtained in lightly allocated multiplex systems. Despite certain counter measures, like scrambling, coding, monitoring of the periodicity, difficulties were encountered in some transmission paths when the input signals were periodic over a longer period. Therefore, known bit-error-measuring devices include a generator for periodic partial sequences which are separately to be switched as e.g. the measuring device PF4 of Wandel and Goltermann GmbH & Co., Eningen U.A. bei Rentlingen, Germany.

The content of the n-bit word representing a period of the periodic signal is set in known word generators and bit-error measuring devices at the start of the measurement and if necessary is electronically stored. This, however, has two drawbacks. Known data transmission devices and data processing devices use certain signals as messages or characteristic states. Although the response of these circuits can be tested in case the matched periodic signal is set, an unintentional defective response of such a circuit to another periodic signal will, however, not be recognized as the variety for a manual setting is too high. Testing of all $2^n$ possible n-bit words is already time consuming when n=8. With n=16, such testing is more or less impractical.

The second drawback arises for the following reason. The measuring result depends frequently not only on the input signal but also on the initial state of the measuring object. Transmission paths are generally organized in their circuit configuration according to exponents of 2 (binary counter, multiplexer, framing structure). Thus, when a periodic signal of a period length of 8 bit or 16 bit is continuously transmitted, the same initial state is always obtained. Even if the critical one of the $2^n$ possible n-bit words is coincidently set, the searched-for error function is obtained only if coincidently the matched initial state of the system existed. Thus, it is almost impossible to find a critical periodic signal by systematic measurements.

OBJECT OF THE INVENTION

It is thus the principal object of the present invention to provide an improved word generator obviating the afore-stated drawbacks.

SUMMARY OF THE INVENTION

We realize this object, in accordance with the present invention by providing a read-only memory from which during a test signal cycle of all possible $2^n$ word sizes and permutations thereof of a n-bit word only n-bit words of an essentially smaller number z are successively read out and the remaining permutations are obtained in accordance with the relation ($2^n-z$) by adding to the periodic part a framing bit sequence which determines the test signal cycle and has a length which does not have a common divisor with n so that in n test signal cycles successively all n possible cyclic permutations of binary digits of words provided in the read-only memory are generated.

The teaching of the invention is based on the following considerations:

In the simplest case, as word generator a n-bit binary counter is usable whose content—periodically repeated—represents the n-bit word and during change to the next signal content counts upwardly or downwardly by 1. Consequently, corresponding periodical signals will be frequently repeated, as the following example for a period length n=4 illustrates:

TABLE 1

| Counter reading | decimal 12 6 3 9 |
|---|---|
| | binary 1100 0110 0011 1001 |

Upon periodic repetition of the binary counter reading, the same periodic sequence is obtained in all illustrated cases, that is a change between two zero bits and two one bits. This is because the four binary numbers blend into each other during cyclic permutation. Similar interrelationships are also obtained for the other possible positions of the imaginary binary counter. For n=4, the following overall picture is obtained:

TABLE 2

| | binary | 1111 | 1110 | 1100 | 1010 | 1000 | 0000 |
|---|---|---|---|---|---|---|---|
| Counter reading | decimal | 15 | 14 | 12 | 10 | 8 | 0 |
| Contained: | decimal | — | 7,11,13 | 6,3,9 | 5 | 4,2,1 | 0 |

Instead of the $2^4=16$ possible 4-bit words, only z=6 are used, that is the words 15, 14, 12, 10, 8 and 0 in order to represent all periodic signals of the 4 bit word length. Calculations for other word lengths n lead to the following numbers z:

TABLE 3

| n | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|
| z | 3 | 4 | 6 | 8 | 14 | 20 | 36 | 60 | 108 | 188 | 352 | 632 | 1182 | 2192 | 4116 |

By successively recalling from the read-only memory only the n-bit words of an essentially smaller number z and to obtain the remaining ($2^n-z$) permutations by adding to the periodic part of the test cycle a framing bit sequence whose length has no common divisor with n, in each test signal cycle based on a fixed n-bit pattern a different cyclic permutation of n-bits of z-words is sent until all n-possible bit positions occur in the pattern after n test signal cycles. The periodically appearing continuous signal is actually provided through m-times repetition of each individual n-bit word. The number m is selecTable, e.g. m=60.

Instead of an n-bit binary counter, the word generator according to the invention is thus a read-only memory for the z n-bit words with a slightly smaller binary counter for addressing the read-only memory. Although in comparison with the prior art, an additional read-only memory is provided, the additional expenses are, however, of minor concern when considering the achieved advantages which are multifold. First, the length of the entire signal cycle is reduced by the factor n and thus the necessary measuring duration is diminished. Taking for example n=16, according to Table 3, a shortening of the periodic portion of the signal cycle is obtained by the factor 65536/4116=15.9 which is approximately equal to n.

Moreover, a certain periodic signal which leads to a reaction of the measuring object (pattern recognition, bit error) is contained only once in the signal cycle. This facilitates the search for this signal.

Generally it is irrelevant which of the several cycle-shifted n-bit words is written in the read-only memory for representing the pertaining periodic signal. It is preferred, however, to define the smallest or highest value. In case the highest value is stored, except for both continuous sequences (0000 . . . , 1111 . . . ) each one of these n-bit words has a 1 in the first digit position and a 0 in the last digit position because otherwise at least one cyclic permutation would lead to a higher value, a fact contradicting the precondition. In the following Table this is illustrated for the examples n=2 to n=6 of the stored n-bit words:

TABLE 4

| nr\n | 6 | 5 | 4 | 3 | 2 |
|---|---|---|---|---|---|
| 1 | 111111 | 11111 | 1111 | 111 | 11 |
| 2 | 111110 | 11110 | 1110 | 110 | 10 |
| 3 | 111100 | 11100 | 1100 | 100 | 00 |
| 4 | 111010 | 11010 | 1010 | 000 | |
| 5 | 111000 | 11000 | 1000 | | |
| 6 | 110110 | 10100 | 0000 | | |
| 7 | 110100 | 10000 | | | |
| 8 | 110010 | 00000 | | | |
| 9 | 110000 | | | | |
| 10 | 101010 | | | | |
| 11 | 101000 | | | | |
| 12 | 100100 | | | | |
| 13 | 100000 | | | | |
| 14 | 000000 | | | | |

According to a further feature of the invention, each n-bit word read out from the read-only memory during a test signal cycle is controlled via a switch and a binary counter and repeated until a set number of repetitions is obtained. Thereafter, another n-bit word is set from the read-only memory automatically via an address counter and a logic and correspondingly repeated. The automatic change of the n-bit word is provided as long as all n-bit words contained in the read-only memory occur once.

Since the framing bit sequence provides that the n-bit word sequence in the following cycle is shifted by as many bits as are obtained as remainder during division of the length of the framing bit sequence by n, the sent sequence of n-bit words is exchanged by cyclic permutation of their bit positions. The length of the framing bit sequence is chosen aliquant to n, thus also the remainder is aliquant to n so that after n test signal cycles all n permutations possible by cyclic permutation occur.

In addition, the framing bit sequence determining the test signal cycle provides the character or marker synchronism between sender and receiver and thus synchronizes also the receiver-side word generator.

An especially preferred test signal cycle is obtained by using the word generator in the sending and receiving part of a bit error measuring device. In this case, the framing bit sequence determining in clock-controlled synchronism the test signal cycle also at the receiver side is represented in a pseudorandom binary sequence (PRBS) generated in a r-stage generator and of a length of $2^r - 1$.

Interleaving of a periodic signal sequence in a pseudorandom binary sequence has essentially three advantages. Firstly, the synchronization of the receiver and the recognition of a failure in synchronism are possible during the PRBS-transmission according to known methods (e.g. German patent DE-PS No. 2,359,716).

Secondly, the length of the PRBS is $(2^r - 1)$ bit when the shift register of the generator has r stages. Thus, the initial point of the subsequent periodic interleaved pattern based on a pattern of $2^x$ (x being an integer) with each PRBS-cycle is shifted by 1 bit. In conventional binary systems, each possible initial state is obtained. In other patterns, r must suitably be selected.

Thirdly, a sending and receiving unit with the word generator according to the invention covers the working range of known bit error measuring devices which transmit only PRBS.

Yet another feature of the invention resides in the use of switches for varying the period length n. In this case, the read-only memory for the word contents is subdivided in address ranges which contain the z n-bit words as required according to Table 3. Via the switches and an address coding, the start address of the selected storage range in the read-only memory is set at the address counter which addresses successively in the read-only memory the z n-bit words to the selected period length n. At the end of the range, the continuous word 1111 . . . is written in for each n.

According to the above consideration, this is the sole word whose last digit is "1" and thus is used as signal for resetting to the pseudorandom binary sequence. When the word length n has a divisor p, so that $n = p \cdot q$, all periodic signals of the word lengths p and q are certainly also periodic with the word length n. It has e.g. n=6 divisor p=2 and q=3. In Table 4, it is shown that the four possible signals for n=3 are contained in the signals no. 1, 6, 12 and 14 in the column for n=6. In similar manner, the three signals for n=2 are contained in the signals no. 1, 10 and 14 in the column for n=6. In case for example the word lengths 16, 15, 14, 13, 12, 11, 10 and 9 are set, all periodic signals of smaller word length are covered because the numbers of 2 to 8 are all factors of the numbers 9 to 16.

A further feature of the invention is based on the following consideration. If during bit error measurement, the transmission unit (the measuring object) shows systematic errors at certain period signals, it is important to determine these signals in order to allow testing as to whether they can occur during practical operation or as to how this defective behavior can be overcome. Complete recording of the error structure with marking of the start of the signal cycle e.g. by artificial bit error sequence (German publication DE-OS No. 2,643,836), allows an immediate reading of which periodic signal results repeatedly in bit errors. Such error structure measuring devices are, however, not always available, especially not at high transmission speeds.

The receiver of a bit-error measuring device equipped with a word generator according to the invention preferably includes a read-write memory in which at each bit error within the periodic portion of the signal cycle the respectively present period content from the word generator is written in. The storage e.g. dimensioned as FIFO-storage (first-in-first-out storage) of critical words contains at a storage depth t the first t signal periods during which bit errors occurred. In case a critical periodic signal and the appropriate initial state is obtained, the bit errors occur approximately also periodic so that an error burst is obtained. The pertaining n-bit word can then be found very frequently in the FIFO-storage. Error bursts of different origin occurring within the activating period of the word generator result also in a multiple storage of the respectively present word. The subsequent error burst of this kind will most probably not occur at the same position of the signal cycle and thus another n-bit word is repeatedly stored. A repeatedly successively occurring n-bit word in the FIFO-storage is an indication for a systematic malfunction by the pertaining periodic signal.

The additional read-write memory can also be used to determine the response of the pattern recognition circuit of a measuring object. In this case, it is only required to utilize instead of the bit error signal the response signal of this recognition circuit as write instruction for the read-write memory. In a correct circuit, only the one n-bit word is repeatedly provided in the read-write memory which was defined for the pattern recognition.

BRIEF DESCRIPTION OF THE DRAWING

The above and other objects, features and advantages of our present invention will become more readily apparent from the following description reference being made to the accompanying drawing in which.

SPECIFIC DESCRIPTION

Figure 1:
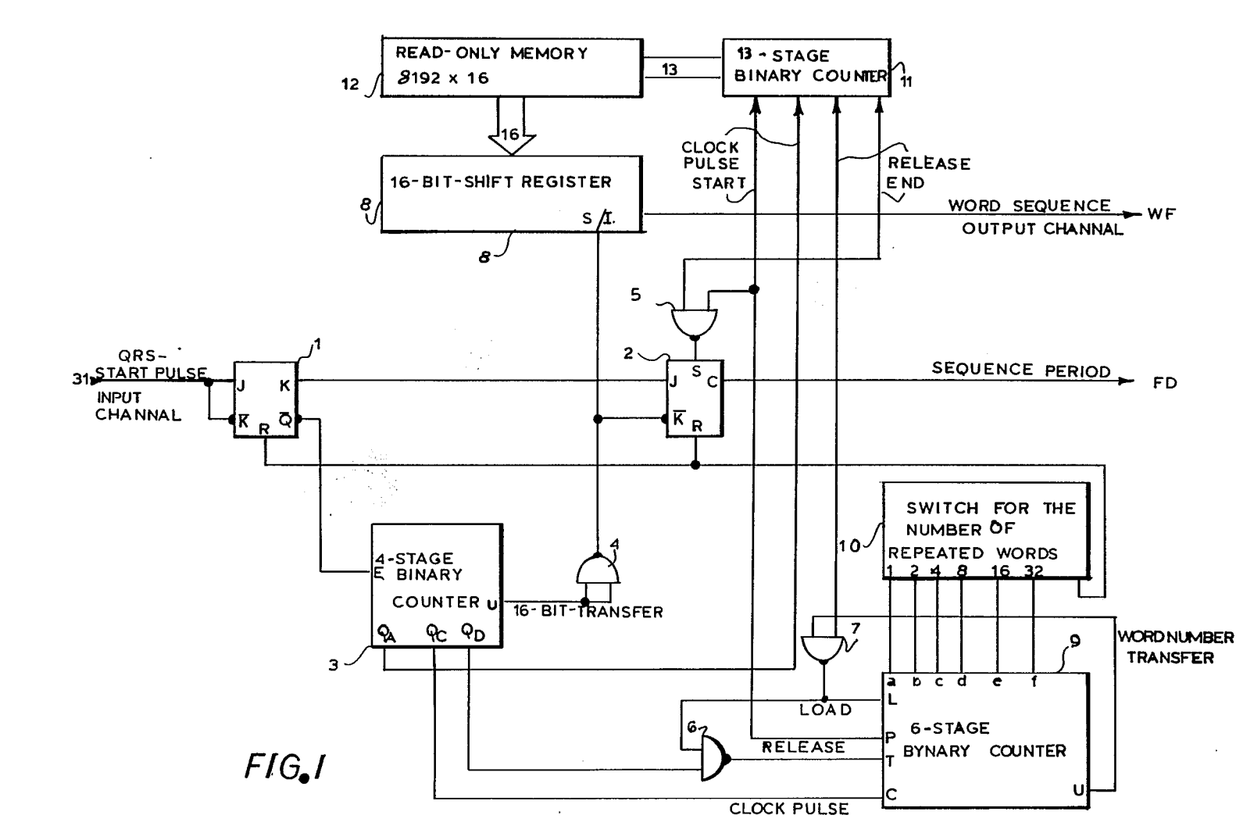
FIG. 1 is a block diagram which illustrates one embodiment of a word generator according to the invention.

FIG. 1, shows a word generator for generating in bit-synchronous manner from the high bit of the cycle start pulse provided at the input channel SWea sequence of words of 16 bits and for transmitting the word sequence to the output channel WF.

During the generation of the word sequence, to the output channel FD a sequential continuous pulse is transmitted which is required to change from the pseudorandom binary sequence (PRBS) measurement to word measurement. Clock synchronization is maintained by utilizing the PRBS cycle for controlling the flipflop and the output shift register. The circuit in the unit which operates at a high speed and is operated with the PRBS-cycle is realized with conventional integrated Schottky-TTL-modules which have a maximum switching speed of above 50 Mbit/s so that a thus equipped device is usable for bit rates up to PCM-hierarchical level of 34,368 Mbit/s.

The word generator as shown in FIG. 1 includes an I.C. module 74F109 provided with a first flipflop 1 having an input J and an inverted input K to which a PRBS-start pulse is transmitted from the input channel SI. The flipflop 1 is further provided with an output Q, an output Q transmitting an inverted signal and a reset input R. Linked to the flipflop 1 is a second flipflop 2 whose input J is connected to the output Q of the flipflop 1 and which further includes an inverted input K, an output Q as well as a set input S and reset input R.

The output Q of the flipflop 1 is connected to the erase input E of an I.C. module 74S163 which includes a synchronous four-phase binary counter 3 with a 16 bit transmission output Ü as well as an output $Q_A$ of the first counting phase, output $Q_C$ of the third counting phase and output $Q_D$ of the fourth counting phase. The counter 3 is also provided with a fourth output which, however, is not illustrated as it is not used in the illustration of the word generator of FIG. 1.

Linked to the binary counter 3 is a first NAND gate 4 of an I.C. module 74S00 which further includes the NAND gates 5, 6, 7. The NAND gate 4 is interposed between the binary counter 3 and a 16-bit shift register 8 which includes four I.C. modules 74S195 each of which containing a parallel-loadable 4-bit shift register reversible via a S/L-control input in clock-controlled synchronism between shifting and loading.

The remaining modules of the word generator are operated at reduced PRBS-cycle thus being slower and of low current drain and include two low-power Schottky-TTL-elements 74LS161 each containing a parallel-loadable four-phase binary counter and which create the six-phase binary counter 9. The binary counter 9 is provided with an enable input P linked to the output Q of the flipflop 2 and an enable input T which is connected to the NAND gate 6. The binary counter 9 further includes a loading input L, a clock input C and a transfer output Ü. Linked to the counter 9 is a switch element 10 which sets the loading signal for the counter 9 including a turnoff signal for the word sequence.

The word generator further contains four modules 74LS161 which provide the thirteen-phase binary counter 11 and two EPROM-storage modules 2764 each of which including a programmable read-only memory of 8192×8 bit size. Together these read-only memories create a read-only memory 12 with 16 outputs.

In the illustrated circuit, the PRBS-start pulse coming from the input channel SWeas high-bit is transmitted to the inputs J,K of the flipflop 1 which are connected to each other. The flipflop 1 works as a D flipflop and conveys the start pulse with positive-going pulse as high-bit to the output Q and as low-bit to the output Q.

The high-bit of the start pulse reaches the input J of flipflop 2 and causes to switch its output Q to high while the low bit is transmitted to the erase input E of the binary counter 3 which thus is reversed by 1 bit from counting to synchronous erasing and is appropriately set to zero at the start of the activation of the flipflop 2.

After respective 16 bit, the counter 3 then provides at its transfer output Ü a high-bit which is inverted by the NAND gate 4. The inverted 16-bit carry pulse is transmitted to the S/L-control input of the shift register 8 to trigger a parallel-loading process for a 16-bit word and to input K of the flipflop 2 to continuously mark the end of the 16 bit word and thus to prepare the bit-dependent reset of the flipflop 2. An instantaneous resetting of the flipflop 2 at the set input S is prevented by a low signal which is transmitted from the output of the NAND gate 5 and is generated by the high signals at its both inputs.

A high signal is provided at the output Q of the flipflop 2 so that its own reset is prevented while the other high signal is an identifier which is momentarily inverted only at the end of the word sequence and then provides the reset of the flip flop 2. The output Q of the flipflop 2 is also connected to the enable input P of the six-phase binary counter 9 which is loaded with the word number m indicating the frequency of generating each individual 16-bit word and which is released by high signal for initiating the counting.

A further condition for counting is the provision of an inactive loading signal i.e. to provide the loading signal in high state. In addition, the signal state at the enable input T must be at high so as to allow the counter 9 to count. This high-state at the enable input T is obtained when at the eight-value input $Q_D$ of the counter 3 which counts the word length bit-by-bit a low signal is provided which is transmitted from the output $Q_D$ to the input of the NAND gate 6 and switches the gate output to high. The signal transmitted from the output $Q_C$ of the counter 3 serves as source of clocking for the counter 9. Since the counter 9 switches with positive-going pulse, the signal states relevant for the four-valued output $Q_C$ during the count value transitions from 3 to 4 and from 11 to 12 are obtained. In view of the requirement that a low signal is provided at the eight-valued output $Q_D$, the count value transition from 3 to 4 remains the sole counting of moment in the 16-bit word.

The 6-phase binary counter 9 counts word-by-word at this count value transition upwardly until its end position i.e. when all counting steps are at high is reached. The transfer output Ü which during the counting is provided with a low signal is switched to high signal which is inverted by the NAND gate 7. The so-inverted transfer signal is transmitted to the loading input L and simultaneously to the first input of NAND gate 6 so that a high signal is maintained at the output of gate 6 when the signal transmitted from the output $Q_D$ of counter 3 is high at the counting positions 8 to 15. Thus, the transfer signal of counter 9 remains switched until the loading step is terminated. This is the case at the positive-going pulse which is triggered during the count value transition from 11 to 12 at the counter 3.

During the loading phase, the complement of a six-digit binary number is loaded into the counter 9 which number is given by respective presetting of the switch element 10. The highest preset number is m=63 corresponding to 63 words of the same 16-bit combination so that each individual 16-bit combination generates a continuous signal of maximal 63×16=1008 bit. At the end of each 16-bit word continuous signal, the transfer output Ü of counter 9 transmits—as described—a high pulse which is characterized in FIG. 1 as word number transfer and is transmitted to the thirteen-phase binary counter 11 as enable pulse.

The counter 11 generates at its thirteen binary outputs the selection addresses of the z=4116 values (see Table 3) in the read-only memory 12. The addressed 16-bit word is transmitted via 16 outputs to the parallel-loading inputs of the shift register 8 which is controlled via the S/L input in such a manner that it loads over a 1 bit period and shifts over a 15 bit period thus providing at its output the desired sequence of different continuous signals respectively formed from series of corresponding 16 bits words. This sequence of words is transmitted from the shift register 8 to the output channel WF.

After executing all 4116 word addresses because of the continuous release of the word number transfer generated by the counter 9, the thirteen-phase binary counter 11 provides an end mark which is characterized by a low signal and is transmitted to the NAND gate 5 whose output is switched to high and thus the set input S of flipflop 2 is rendered inactive.

During the next low signal at the input K, the flipflop 2 is reset i.e. the high signal which was provided during the sequence of words at the output Q and transmitted as sequential continuous signal to the output channel FD is reset to low.

The counter 3 remains in counting operation during word sequence pauses so that the clock signal transmitted at its output $Q_A$ for the counter 11 is maintained. Consequently, the counter 11 is loaded during the word sequence pause with its initial value and prepared for the next start pulse coming from the flipflop 2.

Figure 2:
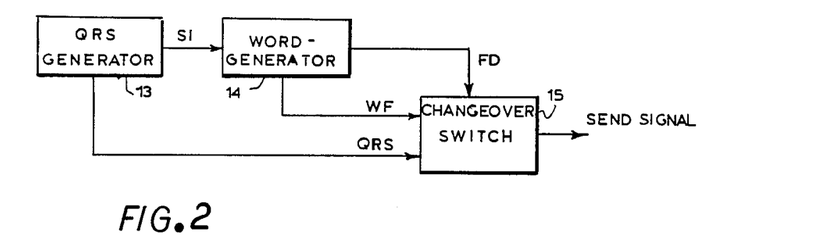
FIG. 2 is a block diagram illustrating the transmission or send-side use of the word generator in a bit error measuring device.

FIG. 2 illustrates the send-side use of the word generator in a bit error measuring device.

Accordingly, a PRBS-generator 13 is provided which transmits a start pulse SWeto the word generator 14 corresponding to the word generator as described in FIG. 1. Linked to the word generator 14 is a change-over switch 15 which receives the word sequence pulse WF and the continuous impulse of the sequence FD and generates a sending signal to the output channel of the bit error measuring device.

The PRBS-generator 13 generates a pseudorandom binary sequence PRBS which is obtained by appropriate feedback of a r-phase shift register such that the sequence has a maximum cycle length of $(2^r-1)$ bit before being repeated. The start of the sequence of words is determined at the send-side and receiver-side by the start pulse SI which is obtained by decoding one of the various $(2^r-1)$ switching states of the shift register.

Interleaving of the word sequence WF into the pseudorandom binary sequence PRBS is provided at the changeover switch 15 during the high state of the sequential continuous signal FD. This is obtained either by having the PRBS-generator 13 operated during the word sequence which means that a portion of the PRBS is substituted by the word sequence or having the PRBS-generator stopped.

In the first case which is shown in FIG. 2, a portion of the PRBS is substituted by the word sequence which means that the PRBS-cycle is longer than the period of the sequence. The longest sequence period of the word generator 14 is 16×63×4116=4,148,928 bit. Thus at complete utilization of the sequence period, the shift register of the PRBS-generator 13 must have at least r=22 steps which corresponds to a cycle length of $2^{22}-1=4,194,303$ bit. One step number by the CCITT recommended is r=23 with PRBS-cycle length of 8,388,607 which is thus possible for the proposed bit error measuring device.

In the second case in which the QSR-generator 13 is stopped during the word sequence, step numbers r<22 can be selected. It should, however, be noted that upon loss of character synchronism at the receiver side, precaution must be taken that the resynchronized comparison PRBS-generator runs continuously until the receiver operates in synchronism with the sender.

Figure 3:
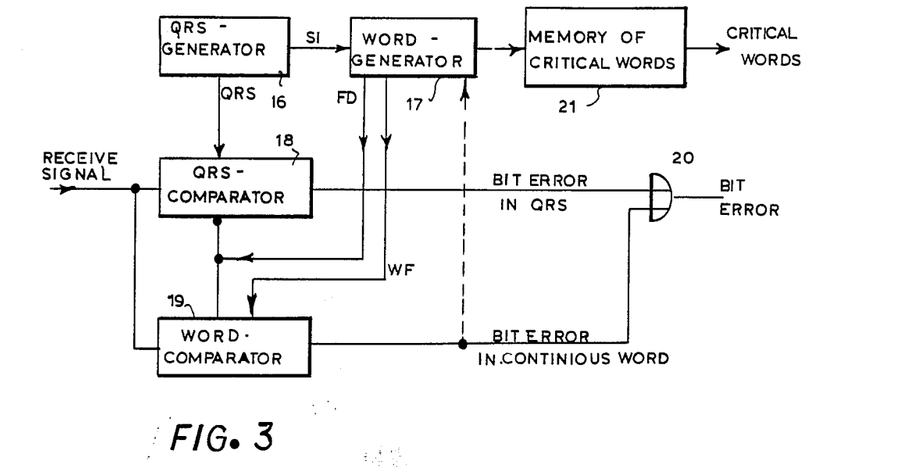
FIG. 3 is a block diagram illustrating the receiver-side use of the word generator in the bit error measuring device.

FIG. 3 shows the receiver-side use of the word generator of FIG. 1 in the bit error measuring device. A PRBS-generator 16 which corresponds essentially to the PRBS-generator 13 as described in connection with FIG. 2 is linked to the word generator 17 as previously described with reference to FIG. 1.

The PRBS-generator 16 is synchronized with the measuring signal transmitted from the send-side and generates a compare signal PRBS within the receiver as well as a start signal SWeindicating the moment when the word sequence interleaved at the send-side starts.

The word generator 17 generates a compare word sequence WF and the sequential continuous signal FD which is transmitted to a PRBS-comparator 18 and a word comparator 19 to activate the respective one depending on the switching state. Both comparators 18,19 receive in addition the receive signal transmitted from the input channel.

At low state of the signal FD, the PRBS-comparator 18 compares the pseudorandom binary sequence PRBS of the generator 16 with the PRBS-portion of the receive signal and at deviations provides a bit-by-bit high signal at its output "bit error in PRBS" which is connected to the first input of a summary element 20.

In a similar manner, the word comparator 19 compares at the high-state of signal FD the word sequence WF of the word generator 17 with the word portion of the receive signal and at deviations provides a bit-by-bit high signal at its output "bit error in the continuous word" which output is connected to the second input of the summary element 20. In the inactive state of comparison, the outputs of both comparators 18,19 are alternatively in the switching state "low".

As can be seen from FIG. 3, the summary element 20 is illustrated as OR gate which provides a high signal at its output in case at least one of its inputs has a high signal. Thus, the bit errors characterized with high in the PRBS and in the continuous word are added and result at the output of the summary element 20 in a bit sequence which provides a low signal at faultless operation and a bit-by-bit high signal at defective operation. This bit sequence is transmitted as error signal to the output channel "bit error".

As is further shown in broken line in the block diagram of FIG. 3, the word generator 17 is connected to a critical words-containing storage 21 which serves as auxiliary unit. Upon recognizing a bit error in the continuous word, the word generator 17 within the receiver is provided at selection address of the error sensitive word i.e. critical word so that the transfer of this word into storage 21 is possible in simple manner.

According to the invention, a writing and reading storage is used which is dimensioned and functions as first in, first out (FIFO) storage and is capable of quickly receiveing critical words and after temporary storage transmitting them to the output "critical words" for recording.

Figure 4:
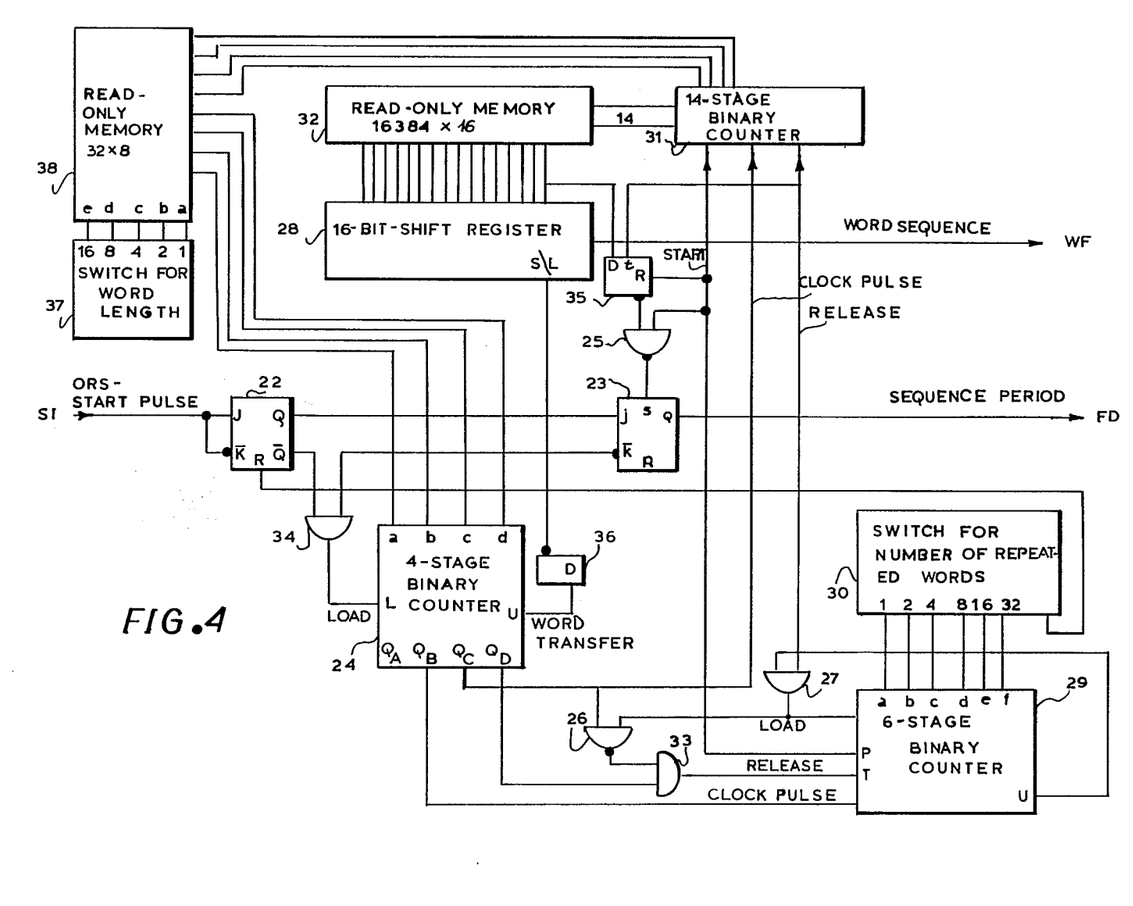
FIG. 4 illustrates the word generator with changeable word length.

FIG. 4 shows a word generator according to the invention with changeable word length n which can be set to n=9, 10, 11, 12, 13, 14, 15, or 16 bit. The word generator is in principle of same structure as the previously described 16-bit word generator of FIG. 1 and thus a sequence of n-bit long words is generated in bit synchronism from the high bit of the PRBS-start pulse at the input channel SI and transmitted to the output channel WF. During the period of the word sequence, a sequential continuous pulse is transmitted at the output channel FD.

In correspondence with the 16-bit word generator of FIG. 1, the word generator of FIG. 4 includes an I.C. module 74F109 containing two flipflops 22,23, an I.C. module 74S163 including a four-phase binary counter 24, an I.C. module 74S00 with four NAND gates of which only three are used and shown that is NAND gates 25,26,27, four I.C. modules 74S195 assembled to form a 16-bit shift register 28, two I.C. modules 74LS161 assembled to form a six-phase binary counter 29, a switch element 30 for setting the loading signal for the counter 29 including a turnoff signal for the word sequence and four modules 74LS161 assembled to form a 14-phase binary counter 31.

The illustrated read-only memory 32 with sixteen outputs is obtained by two EPROM storage modules 27,128 each containing a programmable read-only memory of 16,384×8 bit size.

In addition, the word generator of FIG. 4 includes an I.C. module 74S08 containing four AND gates of which only the two AND gates 33,34 are used and shown, an I.C. module 74S74 including two D flipflops 35,36 with freed outputs Q and inverted outputs Q whereby flipflop 36 is operated with the PRBS-clock pulse, a switch element 37 for input of the desired word length and a PROM storage module 74188 containing a programmable read-only memory 38 of 32×8 bit size for translating the set word length in loading signals for the binary counters 24,31.

In the circuit with changeable word length, the four-phase binary counter 24 may not be operated unsolicited but must be loaded at each word transfer to an initial value which depends on the set word length and which provides that the word transfer distance is equal to the word length. The counter 24 is loaded when a low signal is at its load input L. The low signal can be caused, on the one hand, by the PRBS-start pulse which is received by the flipflop 22 and transmitted as low pulse to its output Q or, on the other hand, by the high word carry pulse which is inverted by the D flipflop 36 under data clock control.

Both signal sources are linked to the inputs of the AND gate 34 and cause a low signal at the output when one of the inputs of the gate 34 receives a low signal. Thus, the load input L of counter 24 is activated which transfers the binary counting value as provided at its four inputs a, b, c, d at positive-going pulse to its counting outputs $Q_A$, $Q_B$, $Q_C$, $Q_D$.

In the 16-bit word operation, the load count value is 0001 and not zero as is the case in the word generator of FIG. 1 because the exchange of the NAND gate 27 which inverts the word carry signal for the inverting flipflop 36 causes a bit delay which is necessary to prevent a chain connection of gates and an adding of signal running time which would decrease the maximal bit rate of the circuit.

Figure 5:
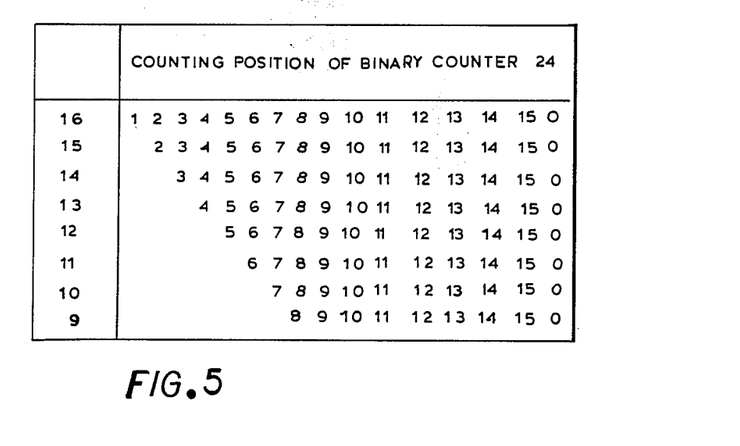
FIG. 5 is a Table for describing the manner of counting of the word length counter.

The load count value is higher when a word length is set of less than 16-bit. The highest load value is obtained with the 9-bit words and amounts 8 i.e. in binary code 1000. The load count values for the remaining word lengths is disclosed in the Table as illustrated in FIG. 5 and which discloses that the count positions 8 (1000), 9 (1001), 10 (1010), 11 (1011), 12 (1100), 13 (1101), 14 (1110), 15 (1111) and 0 (0000) occur in all word lengths.

Consequently, these count positions can be used for the clock control and release control of the counters 29,31. The counter 29 is released for counting when the count positions 8, 9, 10, or 11 are obtained at the counter 24. At this point, the output $Q_D$ which is linked to the first input of AND gate 33 is in the high state and the output $Q_C$ which is linked to the first input of the NAND gate 26 is in the low state. The output of the NAND gate 26 is forced to high state independent on the switching state of its other input.

The high signal is transmitted to the second input of the AND gate 33 and, after the AND operation, is transmitted to the enable input T of the counter 29. The counter 29 is switched with a positive-going pulse of the clock signal transmitted from the output $Q_B$ of counter 24 which generates the positive signal edge during change of the count position 1 to 2, 5 to 6, 9 to 10 and 13 to 14. Of importance in this connection is the change of 9 to 10 during which the counter 29 is increased by one count position.

When the counter 29 reaches its carry position (=word number transfer), i.e. switches the output Ü to high signal, the enable input T must be maintained at high until the load phase is terminated. This is achieved with the low signal of the word number transfer inverted by the NAND gate 27 and which low signal is transmitted to the second input of the NAND gate 26 for maintaining its output at high independent on the signal state at the first input. The next positive-going pulse causes a loading of the counter 29 and is obtained during the count value change from 13 to 14 in the counter 24. The word number transfer is thus active during the count positions 10, 11, 12 and 13. In these positions, the address counter 31 is released which is provided with the clock signal from the output $Q_C$ of counter 24 and switches during count value change from 11 to 12 (positive edge).

The counter 31 is a fourteen stage counter to provide the addresses for the read-only memory 32 which is double the size as in the 16-bit word generator of FIG. 1 because the test words for all provided word lengths n must be included.

Table 3 discloses the number of different test words to be stored for each n from 9 to 16.

To address the read-only memory in a simple manner, the ranges of individual word lengths n start at full Kbit-addresses (1 Kbit=1024 bit) which are loaded into the 14-stage binary counter 31 for the respective word length n during the word sequence pauses.

As can be seen from Table 3, one Kbit-range is sufficient for word lengths n=9, 10, 11, 12 and 13. For a word length n=14, two Kbit are required while for n=15 three Kbit and for n=16 five Kbits are necessary. This results in fifteen of 16 available ranges.

The test words are written in "right-justified" into the 16-bit shift register 28. Since the control signal at the input S/L of the shift register 26 corresponds to the inverted word transfer, the shift register is loaded alternatively by 1 bit and shifted by (n−1) bit so that the correct word sequence with the set word length n is automatically provided at the output of the shift register.

The end of the word sequences must be differently marked in word generators with changing word length than in 16-bit word generators. The last test word is provided in the read-only memory 32 for all word lengths n in the state "all n bit to high" so that the n-th bit of the test word which in all other test words has low signal, is changed to high.

The memory output of the n-th bit is connected with the input D of the flipflop 35 which has the word number carry pulse as clock pulse. At the end of the sequence of words, the carry pulse switches the output Q of the flipflop 35 to low and thus provides the end-of-word mark. The flipflop 35 is asynchronously reset by the output Q of the flipflop 23 during the word sequence pause.

We claim:

1. A digital word generator for automatically generating periodically appearing continuous characters from n-bit words of all word sizes and permutations thereof, comprising a read-only memory provided with means effective during a test signal cycle of all possible $2^n$ word sizes and permutations thereof of a n-bit word for successively reading out only n-bit words of an essentially smaller number z, and means for obtaining the remaining permutations in accordance with the relation $(2^n-z)$ by adding to the periodic part a framing bit sequence which determines said test signal cycle and has a length which does not have a common divisor with n so that in n test signal cycles successively all n possible cyclic permutations of binary digits of words provided in said read-only memory are generated.

2. A digital word generator for automatically generating periodically appearing continuous characters from n-bit words of all word sizes and permutations thereof, comprising: a read-only memory from which during a test signal cycle of all possible $2^n$ word sizes and permutations thereof of a n-bit word only n-bit words of an essentially smaller number z are successively read out and the remaining permutations in accordance with the relation $(2^n-z)$ are obtained by adding to the periodic part a framing bit sequence which determines said test signal cycle and has a length which does not have a common divisor with n so that in n test signal cycles successively all n possible cyclic permutations of binary digits of words provided in said read-only memory are generated, a switch and a binary counter connected so that each n-bit word read out from said read-only memory during one test signal cycle is controlled via said switch and said binary counter and repeated until a set number of repetitions is obtained.

3. A digital generator as defined in claim 2, further comprising an address counter and a logic connected so that another n-bit word is automatically read out via said address counter and said logic from said read-only memory after the repetitions of the read out n-bit word and correspondingly repeated wherein said automatic permutation is provided until all n-bit words containing in said read-only memory occur once.

4. A digital word generator for automatically generating periodically appearing continuous characters from n-bit words of all word sizes and permutations thereof, comprising: a read-only memory from which during a test signal cycle of all possible $2^n$ word sizes and permutations thereof of a n-bit word only n-bit words of an essentially smaller number z are successively read out and the remaining permutations in accordance with the relation $(2^n-z)$ are obtained by adding to the periodic part a framing bit sequence which determines said test signal cycle and has a length which does not have a common divisor with n so that in n test signal cycles successively all n possible cyclic permutations of binary digits of words provided in said read-only memory are generated, one such word generator being incorporated each in a respective send-side and a respective receiver-side portion of a bit error measuring device including a changeover switch and a r-stage generator providing a pseudorandom binary sequence of a length in accordance with the relation $2^r-1$, said framing bit sequence determining said test signal cycle and the character synchronism being represented by said pseudorandom binary sequence in which said sequence of n-bit words as generated by said word generator is interleaved in a predetermined pattern position via said changeover switch.

5. A bit error measuring device as defined in claim 4 wherein said bit error measuring device includes a read-write memory for receiver-side recording of all those critical n-bit words which show errors during continuous transmission and are added to the bit error output listing as additional information.

6. A digital word generator for automatically generating periodically appearing continuous characters from n-bit words of all word sizes and permutations thereof, comprising: a read-only memory from which during a test signal cycle of all possible $2^n$ word sizes and permutations thereof of a n-bit word only n-bit words of an essentially smaller number z are successively read out and the remaining permutations in accordance with the relation $(2^n-z)$ are obtained by adding to the periodic part a framing bit sequence which determines said test signal cycle and has a length which does not have a common divisor with n so that in n test signal cycles successively all n possible cyclic permutations of binary digits of words provided in said read-only memory are generated, and a second read-only memory, said send-side and receiver-side read-only memories being set with a word length n of n-bit words for all values of n=9 to 16 bit which range covers also the word lengths n=1 to 8 bit so that all continuous sequences generated with word lengths n=1 to 16 bit are transmittable.

* * * * *